United States Patent
Yu et al.

(10) Patent No.: US 10,192,732 B2
(45) Date of Patent: Jan. 29, 2019

(54) CONTAMINANT REMOVAL IN ULTRA-THIN SEMICONDUCTOR DEVICE FABRICATION

(71) Applicant: Texas Instruments Incorporated, Dallas, TX (US)

(72) Inventors: Qin Xu Yu, Sichuan (CN); Tian Yi Zhang, Sichuan (CN); Jian Jun Kong, Sichuan (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/343,946

(22) Filed: Nov. 4, 2016

(65) Prior Publication Data

US 2018/0005818 A1    Jan. 4, 2018

Related U.S. Application Data

(63) Continuation of application No. PCT/CN2016/087961, filed on Jun. 30, 2016.

(51) Int. Cl.
| | |
|---|---|
| *H01L 21/02* | (2006.01) |
| *H01L 21/683* | (2006.01) |
| *H01L 21/285* | (2006.01) |
| *H01L 29/66* | (2006.01) |
| *H01L 29/78* | (2006.01) |
| *H01L 29/417* | (2006.01) |
| *H01L 29/06* | (2006.01) |
| *H01L 29/40* | (2006.01) |
| *H01L 29/10* | (2006.01) |

(52) U.S. Cl.
CPC .. *H01L 21/02057* (2013.01); *H01L 21/28512* (2013.01); *H01L 21/6836* (2013.01); *H01L 29/0626* (2013.01); *H01L 29/4175* (2013.01); *H01L 29/41766* (2013.01); *H01L 29/66712* (2013.01); *H01L 29/781* (2013.01); *H01L 29/7835* (2013.01); *H01L 29/1045* (2013.01); *H01L 29/404* (2013.01); *H01L 2221/6834* (2013.01); *H01L 2221/68327* (2013.01)

(58) Field of Classification Search
CPC ............. H01L 21/02057; H01L 21/304; H01L 21/6836; H01L 2221/6834; H01L 2221/68327
See application file for complete search history.

(56) References Cited

U.S. PATENT DOCUMENTS

| | | | | |
|---|---|---|---|---|
| 6,245,677 B1 * | 6/2001 | Haq | ...................... | B24B 37/042 |
| | | | | 257/E21.219 |
| 8,222,118 B2 * | 7/2012 | Dydyk | .................. | H01L 21/304 |
| | | | | 438/459 |

(Continued)

FOREIGN PATENT DOCUMENTS

JP     2000232085    *   8/2000

*Primary Examiner* — Michael Carter
(74) *Attorney, Agent, or Firm* — Andrew R. Ralston; Charles A. Brill; Frank D. Cimino

(57) ABSTRACT

A chemical solution cleaning process for removing backside contamination prior to metallization involves selective chemistries of a mixture containing $NH_4OH$ and $H_2O_2$ that may be diluted to specific concentrations depending upon the topside metal and passivation of a semiconductor wafer, which is applied after removing a topside protection material to protect the topside circuitry.

19 Claims, 3 Drawing Sheets

(56) References Cited

U.S. PATENT DOCUMENTS

| | | |
|---|---|---|
| 8,614,480 B2 | 12/2013 | Wang et al. |
| 2005/0082608 A1* | 4/2005 | Inagawa ............. H01L 29/7813 |
| | | 257/330 |
| 2007/0166851 A1* | 7/2007 | Tran ........................ H01L 33/22 |
| | | 438/22 |

* cited by examiner

CONTAMINANT REMOVAL IN ULTRA-THIN SEMICONDUCTOR DEVICE FABRICATION

PRIORITY AND CROSS-REFERENCE TO RELATED APPLICATION(S)

This is a continuation of copending International Application No. PCT/CN2016/087961, with an international filing date of Jun. 30, 2016, entitled "CONTAMINANT REMOVAL IN ULTRA-THIN SEMICONDUCTOR DEVICE FABRICATION," in the name(s) of: Qin Xu Yu, Tian Yi Zhang, and Jian Jun Kong, which designated the United States and is hereby fully incorporated herein by reference for all purposes.

FIELD OF THE DISCLOSURE

This disclosure relates generally to the field of semiconductor devices and the methods of fabrication thereof, and more particularly, without limitation, to contaminant removal in the fabrication of ultra-thin semiconductor devices such as, e.g., power MOSFET circuits.

BACKGROUND

Without limitation, the following is provided in the context of fabricating ultra-thin semiconductor devices such as, e.g., power MOSFET circuits. Wafer backside grinding (BSG) is conventionally employed to reduce the original thickness of a semiconductor wafer after device fabrication and passivation. The profile of a wafer is reduced to a desired thickness suitable for assembling dies (obtained after wafer singulation step) on substrate packages as well as to ensure proper electrical operation of certain types of semiconductor devices, e.g., power management devices. Additionally, such ultra-thin power management devices also require backside metallization after backside grinding.

It is known that semiconductor devices may include one or more backside metal layers for forming a good Ohmic contact to the underlying substrate. As the advances in the design of integrated circuits (ICs) continue to take place, including ever-shrinking line geometries fabricated on increasing wafer diameters, improvements in backside preparation are also being continually sought.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In one aspect, an embodiment of a method in fabricating a semiconductor device is disclosed. The claimed embodiment comprises, inter alia, forming topside circuitry for an integrated circuit (IC) in a semiconductor substrate of the semiconductor device, the topside circuitry having a topside metal and passivation structure, and applying a topside protection material to protect the topside circuitry. Thereafter, the semiconductor substrate's backside is ground or polished to a select thickness, which may be followed by performing an etching process to impart a roughness to the semiconductor substrate's backside in an example implementation. After removal of the topside protection material, a chemical solution cleaning process is applied to remove contaminants from the semiconductor substrate's backside. A deionized (DI) water cleaning process may be applied to the semiconductor device after the chemical cleaning process. Thereafter, a backside metallization (BSM) layer may be formed over the backside of the semiconductor substrate.

In another aspect, an embodiment of a semiconductor device is disclosed. The claimed embodiment comprises, inter alia, topside circuitry for an IC formed in a semiconductor substrate, the topside circuitry having a topside metal and passivation structure disposed thereon, wherein the semiconductor substrate's backside is thinned to a select thickness after applying a topside protection material to protect the topside circuitry. The semiconductor device also includes a BSM layer formed over the backside of the semiconductor substrate, wherein the semiconductor substrate's backside is cleaned by a chemical solution cleaning process to remove contaminants, after removing the topside protection material applied to the topside circuitry for protection before thinning the backside.

In one embodiment, the IC may comprise a power MOSFET circuit wherein the semiconductor substrate is ground to a thickness of about 35 to 400 microns ($\mu m$). In an example implementation, the power MOSFET circuit may be provided with a topside metal and passivation structure comprising a gold (Au) metal and polyimide passivation structure. In another example implementation, the power MOSFET circuit may be provided with a topside metal and passivation structure comprising an aluminum (Al) metal and dielectric passivation structure. A chemical solution cleaning process for removing backside contamination prior to metallization according to an embodiment involves selective chemistries of a mixture containing $NH_4OH$ and $H_2O_2$ that may be diluted to specific concentrations depending upon the topside metal and passivation of the semiconductor wafer.

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

DETAILED DESCRIPTION OF THE DRAWINGS

Figure 1:
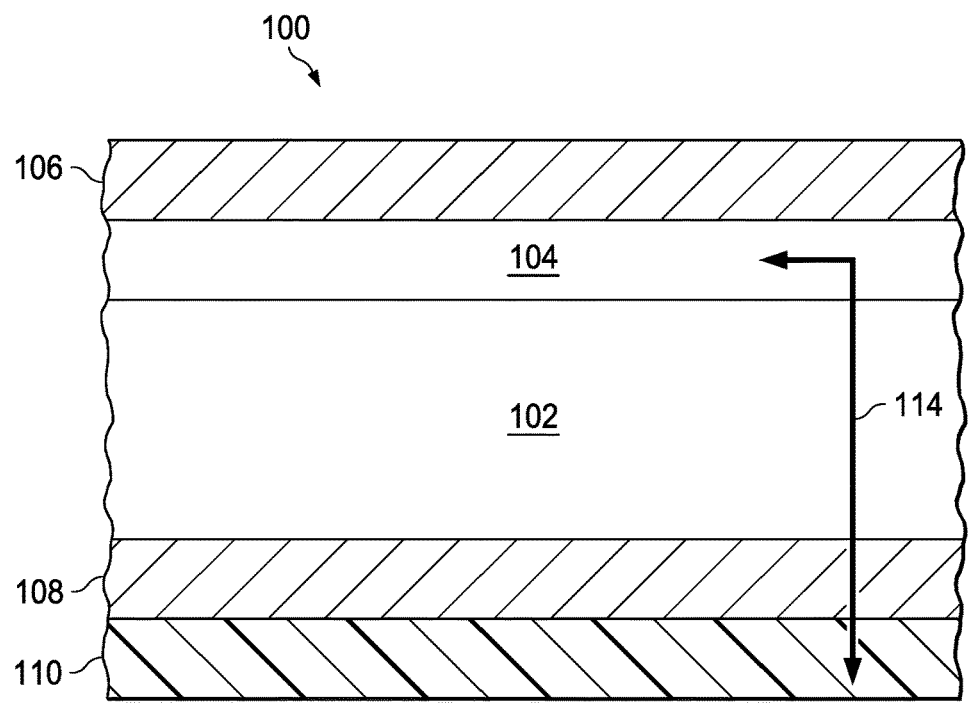
FIG. 1 is a simplified cross-sectional view of an example semiconductor device having a backside metallization (BSM) layer wherein an embodiment of the present invention may be practiced.

The present invention is described with reference to the attached Figures wherein like reference numerals are generally utilized to refer to like elements throughout. The Figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In the following description, reference may be made to the accompanying drawings wherein certain directional terminology, such as, e.g., "upper", "lower", "top", "bottom", "left-hand", "right-hand", "front side", "backside", "vertical", "horizontal", etc., may be used with reference to the orientation of the Figures or illustrative elements thereof being described. Since components of embodiments can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. It is understood that further embodiments may be utilized and structural or logical changes may be made without departing from the scope of the present invention. The features of the various exemplary embodiments described herein may be combined with each other unless specifically noted otherwise.

As employed in this specification, the terms "coupled", "electrically coupled", "connected" or "electrically connected" are not meant to mean that elements must be directly coupled or connected together. Intervening elements may be provided between the "coupled", "electrically coupled", "connected" or "electrically connected" elements.

Example semiconductor devices described below may include or formed of a semiconductor material like Si, SiC, SiGe, GaAs or an organic semiconductor material. The semiconductor material may be embodied as a semiconductor wafer or a semiconductor chip containing a range of different types of IC and/or discrete devices, for example including but not limited to, planar or trench power MOSFETs (Metal Oxide Semiconductor Field Effect Transistors), Bipolar Junction Transistors (BJTs), 3-D microelectromechanical components or systems (MEMS), Insulated-Gate Bipolar Transistors (IGBTs), and the like.

An example semiconductor chip, device, die or wafer or a portion thereof may further include inorganic and/or organic materials that are not semiconductors, for example, insulators such as dielectric layers, plastics or metals, etc.

Referring now to the drawings and more particularly to FIG. 1, shown therein is a simplified cross-sectional view of an example semiconductor device, die, or portion of a wafer 100 having a backside metallization (BSM) layer 108 wherein an embodiment of the present invention may be practiced. By way of illustration, such a semiconductor device may represent a range of semiconductor devices, ICs or discrete devices, that require wafer thinning and metallization processes. For instance, semiconductor device 100 may comprise an ultra-thin power MOSFET circuit that may be fabricated using a class of process technologies and flows specified and/or standardized for manufacture of various types of power MOSFET devices (n-channel or p-channel, trench, vertical or planar, source-down or drain-down configurations, etc.). As one skilled in the art will recognize, such process technologies may comprise a particular sequence of process steps depending on the foundry and specific fabrication process, which may be grouped as a series of front end-of-line (FEOL) steps followed by a group of back end-of-line (BEOL) steps, wherein a number of process steps may be applied as part of backside processing and metallization. As part of a high-level rendition of the example semiconductor device 100, topside circuitry 104 is illustratively shown as being formed in or on a suitable substrate 102 that may be, for example, part of a bulk silicon wafer. A suitable topside metal and passivation structure 106 may be formed or otherwise disposed on the topside circuitry portion 104 of the device 100. The topside circuitry 104 may comprise an example power MOSFET formed in the Si substrate 102, which depends on a vertical electrical current through the substrate 102, illustratively shown as a current loop 114, for operation. The wafer containing the MOSET devices may therefore be subjected to a backgrind operation in order to remove sufficient substrate material and thereby obtain a select thinness or thickness of about 50 to 100 microns (µm). Depending on the fabrication process, a suitable backside metal layer 108 is deposited over the Si substrate. Semiconductor device 100 may be a representation of a singulated semiconductor die containing the example power MOSFET circuitry that is illustratively shown with an epoxy layer 110 for die attach.

A backside preparation process for the example semiconductor device 100 involving backside thinning may also include rough or texture etching followed by de-taping/removal of any protective material used for protecting the topside circuitry, metal and passivation structures of the device 100. These steps can give rise to various contaminants such as chemical residue, organic particulates, metal particles, foreign substances acquired through human operator contact, etc. that may remain on the surface of the substrate's backside even after typical deionized (DI) water cleaning processes, especially in the fabrication of ultra-thin wafers with increasing wafer diameters that require at least some types of wafer backside handling.

Figure 2:
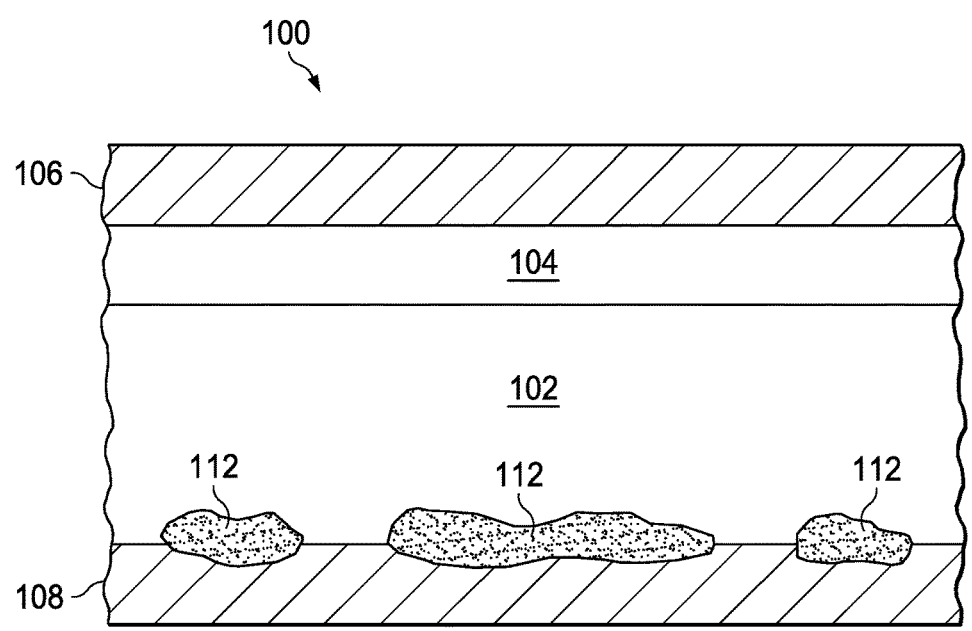
FIG. 2 depicts another view of the example semiconductor device shown in FIG. 1 that illustrates formation and/or occurrence of contaminants due to backside processing that may remain before metallization.

Forming a BSM layer without adequately cleaning the backside surface of the substrate can trap various residual contaminants 112 between the Si substrate 102 and the metallization layer 108, as illustrated in FIG. 2. Such contaminants may comprise different particulate/debris compositions and/or sizes, and can act as an Ohmic contact barrier that negatively affects the current loop of the power MOSFET device 100 regardless of whether it is configured as a source-down device wherein a source contact metal layer is provided as the BSM layer 108 or whether it is configured as a drain-down device wherein a drain contact metal layer is provided as the BSM layer 108. Also, because the trapped contaminants 112 can reduce adhesion between metallization layer 108 and substrate 102, mechanical issues such as metal peeling, compromised structural integrity, internal stresses, etc. may be encountered and/or exacerbated at one or more downstream process steps, e.g., singulation and die attach.

By way of further illustration, fabrication of a power MOSFET semiconductor device representative of the semiconductor device 100 set forth above will be described in the following sections in additional detail for practicing an example embodiment of the present invention with respect to removing residual contaminants and other unwanted foreign particulate matter from the substrate prior to backside metallization. Broadly, in one example implementation, a power MOSFET may be formed in a semiconductor device with a parallel combination of a shunt resistor and a diode-connected MOSFET between a gate input node of the semiconductor device and a gate of the power MOSFET. The power MOSFET and the diode-connected MOSFET may be integrated into a substrate of the semiconductor device so that source and drain nodes of the diode-connected MOSFET are electrically isolated from a source node of the power MOSFET through diodes formed of pn junctions in the semiconductor substrate of the semiconductor device. A gate of the diode-connected MOSFET may be connected to the gate of the power MOSFET. The diode-connected MOSFET source and drain nodes may be connected to a source node of the power MOSFET through diodes. The source node of the diode-connected MOSFET may be connected to the gate input node of the semiconductor device. The drain node of the diode-connected MOSFET may be connected to the gate of the power MOSFET. When the power MOSFET is turned on by applying a turn-on signal to the gate input node of the semiconductor device, resistance of the diode-connected MOSFET is significantly higher than the parallel shunt resistor, so that the shunt resistor controls the turn-on time. When the power MOSFET is turned off by applying a turn-off signal to the gate input node of the semiconductor device, resistance of the diode-connected MOSFET is significantly lower than the parallel shunt resistor, so that the diode-connected MOSFET controls the turn-off time.

The semiconductor device may be a discrete power device that includes an extended drain MOS transistor with shunt resistor and diode-connected MOSFET described herein. Alternatively, the semiconductor device may be an integrated circuit that includes other circuits, such as sense circuits and/or control circuits, in addition to the power device described herein.

Figure 3:
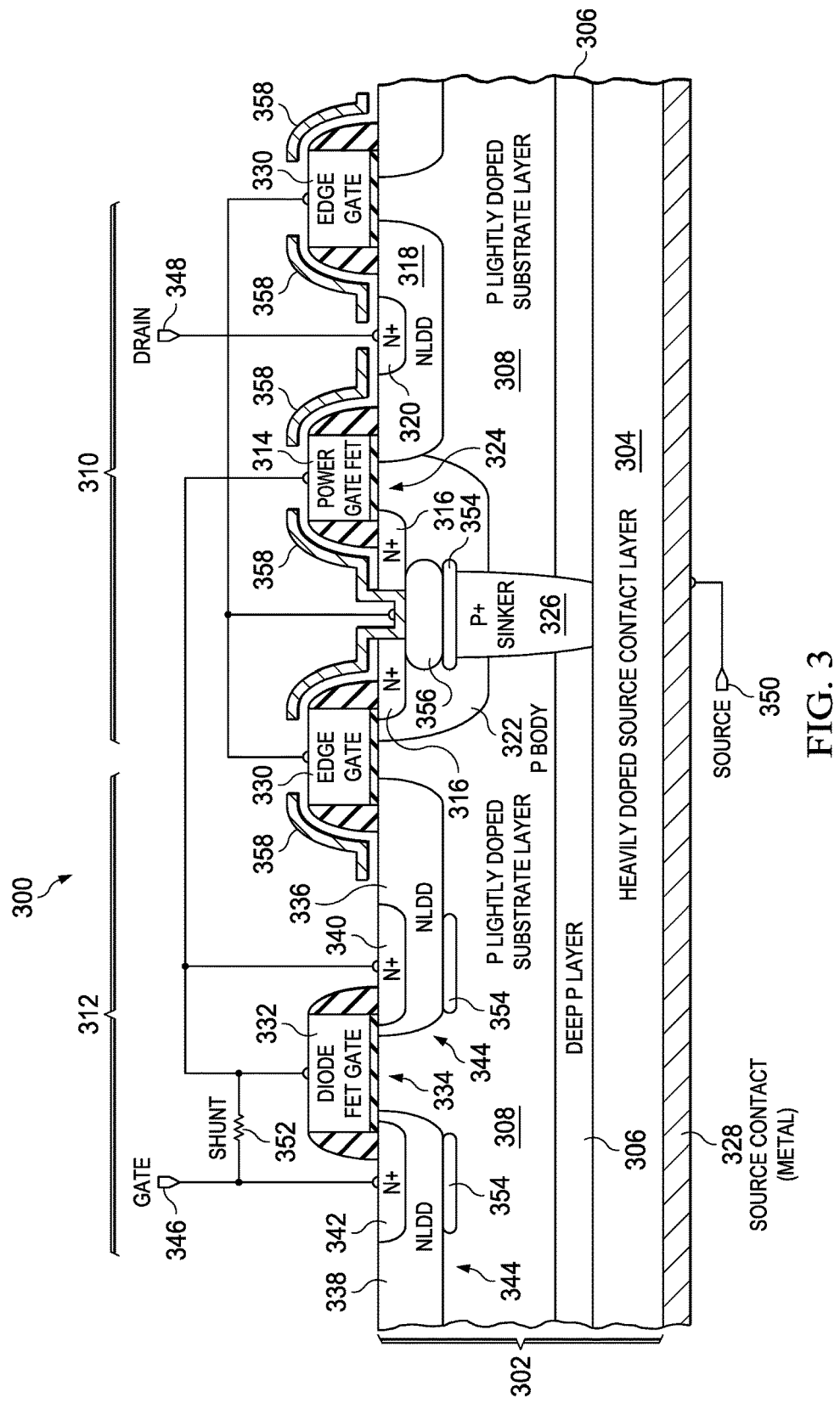
FIG. 3 depicts a cross-sectional view of an example n-channel power MOSFET circuit formed in a semiconductor device wherein backside contaminants may be advantageously removed according to an embodiment of the present invention.

FIG. 3 is a cross-sectional view of a semiconductor device containing a vertical n-channel power MOSFET in a source-down configuration with a gate connected through a parallel shunt resistor and diode-connected MOSFET. It will be recognized that a p-channel version may be realized by appropriate changes of polarity of elements of the semiconductor device, mutatis mutandis. The semiconductor device 300 is formed in and on a p-type semiconductor substrate 302 and includes a heavily doped p-type source contact layer 304 at a bottom surface of the substrate 302. A deep p-type layer 306 is formed or otherwise disposed in the substrate, leaving 0.5 to 10 μm of lightly doped p-type substrate material 308 at a top surface of the substrate 302. The semiconductor device 300 includes an area defined for the power MOSFET 310 and an area defined for the diode-connected MOSFET 312 proximate to the power MOSFET 310.

The power MOSFET 310 is provided with a gate structure 314 which includes a gate dielectric layer disposed on the top surface of the substrate 302 and a gate disposed on the gate dielectric layer. The gate may have an optional layer of metal silicide formed at a top surface of the gate. The power MOSFET 310 includes an n-type source region 316 in the substrate 302 at least partially underlying the power MOSFET gate structure 314. The power MOSFET 310 further includes an n-type extended lightly doped drain (NLDD) region 318 in the substrate 302 adjacent to the power MOSFET gate structure 314 opposite from the source region 316. The extended NLDD region 318 contains an n-type drain contact region 320 with a same average doping density as the source region 316. A p-type body region 322 of the power MOSFET 310 is formed or otherwise disposed in the substrate 302 and extends to a channel region 324 under the power MOSFET gate structure 314 between the source region 316 and the extended NLDD region 318. An effective gate length of the power MOSFET 310, corresponding to a lateral distance between the source region 316 and the extended NLDD region 318, may be, for example, 0.2 to 1.5 μm. A p-type sinker 326 is disposed in the substrate 302 and provides a low electrical impedance connection between the body region 322 and the source contact layer 304. A metal source contact layer 328 is disposed on the bottom surface or backside of the substrate 302, which one example embodiment may comprise a metal layer of a composition selected from the group consisting of titanium (Ti), titanium-nickel-argentum (Ti—Ni—Ag), nickel-vanadium (Ni—V), nickel-vanadium-argentum (Ni—V—Ag), nickel-vanadium-gold (Ni—V—Au), titanium-platinum-gold (Ti—Pt—Au), gold-titanium-nickel-vanadium-argentum (Au—Ti—Ni—V—Ag) and chromium-nickel-vanadium-argentum (Cr—Ni—V—Ag), etc., that may be formed or deposited by physical/chemical vapor deposition (P/CVD), sputter deposition, plating, and the like. Prior to forming the backside metallization, the substrate 302 will be thinned to a specific thickness and further processed according to an embodiment set forth further below for contaminant removal.

An edge gate 330 may be disposed over the substrate 302 so as to overlap the extended NLDD region 318. The edge gate 330 may have a same structure as the power MOSFET gate structure 314.

In the example semiconductor device 300, the diode-connected MOSFET 312 has a gate structure 332 that may be provided with the same layer structure as the power MOSFET gate structure 314. The lightly doped substrate 308 may extend to a channel region 334 under the diode-connected MOSFET gate structure 332 to provide a body region for the diode-connected MOSFET 312. The diode-connected MOSFET 312 includes an n-type drain NLDD region 336 and an n-type source NLDD region 338 in the substrate 302 adjacent to, and on opposite sides of, the diode-connected MOSFET gate structure 332. The drain NLDD region 336 and the source NLDD region 338 have average doping densities substantially equal to the power MOSFET extended NLDD region 318. The drain NLDD region 336 contains an n-type drain contact region 340 and the source NLDD region 338 contains an n-type source contact region 342; both the drain contact region 340 and the source contact region 342 have an average doping density substantially equal to the power MOSFET source region 316 and power MOSFET drain contact region 320. The drain NLDD region 336 and the source NLDD region 338 are electrically isolated from the power MOSFET source region 316 through pn junctions 344 at boundaries between the drain NLDD region 336 and the source NLDD region 338 and the lightly doped substrate 308. An effective gate length of the diode-connected MOSFET 312, corresponding to a lateral distance between the drain NLDD region 336 and the source NLDD region 338, may be, for example, 0.5 to 2 µm. The edge gate 330 may overlap the diode-connected MOSFET drain NLDD region 336, as depicted in FIG. 3, and possibly the diode-connected MOSFET source NLDD region 338. Suitable metal interconnects are disposed over the substrate 302 so as to electrically connect elements of the power MOSFET 310 and the diode-connected MOSFET 312. A gate input node 346 of the semiconductor device 300 is directly connected to the diode-connected MOSFET source contact region 342. A drain input/output node 348 of the semiconductor device 300 is directly connected to the power MOSFET drain contact region 320. A source input/output node 350 of the semiconductor device 300 is directly connected to the source contact layer 328. The gate input node 346 is connected through a shunt resistor 352 to the diode-connected MOSFET gate structure 332. The diode-connected MOSFET gate structure 332 is directly connected to the diode-connected MOSFET drain contact region 340 and the power MOSFET gate structure 314. The power MOSFET source region 316 may be connected to the edge gate 330. Alternatively, the edge gate 330 may be biased by a separate voltage source. The source region 316 may be recessed as depicted in FIG. 3 so that source contact metal 358 makes electrical connection to the body region 322 and to the source region 316. The source contact metal 358 may extend over the power MOSFET source region 316 and over the power MOSFET gate structure 314, the edge gate 330 and the power MOSFET extended NLDD region 318, isolated by a dielectric layer, to form a field plate structure. The field plate may act as a shield electrode, decoupling the gate input node 346 from the drain input/output node 348. It may also help to deplete the LDD region when a positive bias is applied to the drain input/output node 348, advantageously improving hot carrier reliability of the power MOSFET 310.

Performance of the semiconductor device 300 may be enhanced by forming optional p-type heavily doped breakdown layers 354 disposed in the lightly doped substrate 308 under the diode-connected MOSFET drain contact region 340 and source contact region 342, at a lower boundary of the diode-connected MOSFET drain NLDD region 336 and at a lower boundary of the source NLDD region 338. An average doping density of the breakdown layers 354 is selected to provide a desired breakdown voltage of the pn junction at the boundary which is lower in magnitude than a breakdown voltage of the diode-connected MOSFET gate dielectric layer. For example, an average doping density above $5 \times 10^{17}$ cm$^{-3}$ may desirably provide a breakdown voltage determined by a doping density of the diode-connected MOSFET drain NLDD region 336 and source NLDD region 338 adjacent to the breakdown layers 354. During operation of the semiconductor device 300, junction breakdown induced by the breakdown layers 354 desirably provides protection against voltage transient damage and electrostatic discharge (ESD) damage to the power MOSFET gate dielectric layer. A shallow p-type breakdown layer 356 may be disposed directly under the power MOSFET source region 316 to improve an unclamped inductive switching (UIS) capability of the power MOSFET 310.

One skilled in the art will appreciate that the substrate 302 and the circuit elements formed therein and/or thereon are generally illustrative of the substrate 102 and topside circuitry 104 shown in FIGS. 1 and 2 described hereinabove. Furthermore, various metal and dielectric layers set forth above may be representative of the topside metal and passivation structure 106 of FIGS. 1 and 2. In one example process flow, the topside metal structure may comprise a gold (Au) metal structure and associated topside passivation structure may comprise a polyimide structure. In another example process flow, a topside metallization structure may comprise an aluminum (Al) metal structure and associated topside passivation structure may comprise a dielectric material structure including, e.g., oxide, oxynitride, and the like. It will be recognized by one skilled in the art that a topside passivation structure may be formed as one or more layers of various thicknesses (e.g., several thousands of Angstroms). Other topside metalization processes may include tantalum nitride (TaN), nickel (Ni), palladium (Pd), titanium nitride (TiN), and titanium (Ti), tungsten (W), titanium-tungsten, Cu—Ti, NiPd(Au), tungsten nitride (W—N), titanium silicon nitride (Ti—Si—N), tantalum silicon nitride (Ta—Si—N), molybdenum (Mo), etc. as well as any combinations thereof in various stoichiometric ratios and thicknesses.

Similar to the source-down configuration of a power MOSFET device 300 described above, a vertical n-channel power MOSFET in a drain-down configuration may also be fabricated in analogous fashion, mutatis mutandis, wherein a drain contact is provided by way of suitable metallization at the backside of the semiconductor device that may be thinned and processed according to an embodiment of the present patent application.

Figure 4:
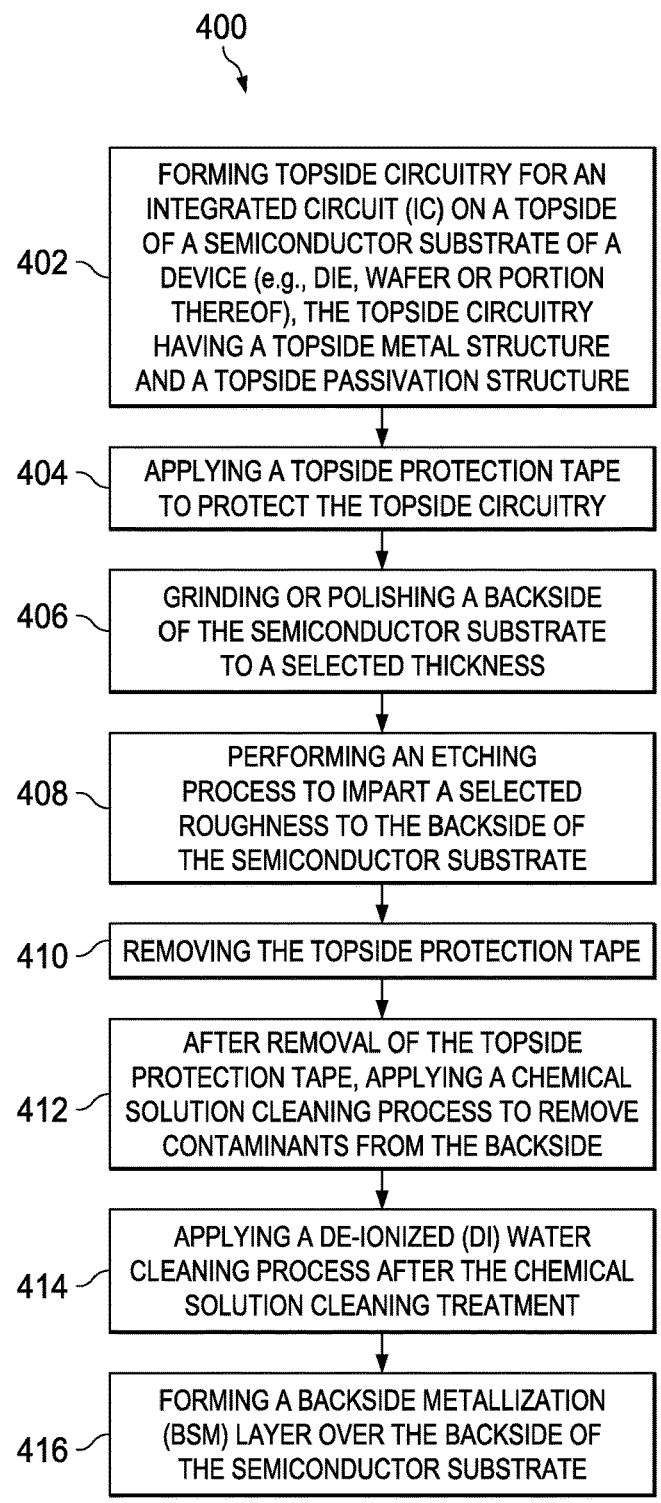
FIG. 4 is a flowchart of an example process for removing backside contaminants in the manufacture of a semiconductor device according to an embodiment of the present invention.

As noted above, wafers containing semiconductor devices that may be required to operate at high power levels (e.g., power management devices such as Shockley diodes, power MOSFETs, BJTs, IGBTs, etc.) need to be thinned to a select thickness (e.g., in order to provide the ability to dissipate heat by lowering the thermal resistance, ensure proper electrical/operational characteristics relating to current loops, etc. inter alia) prior to dicing and sawing (i.e., singulation) and die attach. To improve backside surface preparation and adhesion characteristics including barrier/solder wettability, the backside needs to be as clean as possible before metallization as pointed out in reference to FIGS. 1 and 2. Turning to FIG. 4, set forth therein is a flowchart of an example process 400 for removing backside contaminants in the manufacture of a semiconductor device, e.g., semiconductor devices 100, 300, according to an embodiment of the present invention. At block 402, appropriate topside circuitry for an integrated circuit (IC) may be formed on a topside of a semiconductor substrate of the semiconductor device, wherein the topside circuitry may be provided with a topside metal structure and associated topside passivation structure as set forth in detail hereinabove in an example power MOSFET fabrication process. At block 404, a topside protection material may be applied to the front of the wafer/device to protect the topside circuitry. In one implementation, such topside protection materials may comprise plastic tapes with pre-coated adhesives, etc., that may be applied to the semiconductor wafer after fabricating the topside circuitry, whose substrate may initially have a thickness of several hundreds of microns. For instance, the topside (i.e., frontside) of a wafer containing the power MOSFET devices may be laminated with a backgrind adhesive tape to prepare for subsequent process steps. It should be appreciated that application of such an adhesive tape protects the wafer from damage during wafer backside processing. In particular, the adhesive tape protects wafer frontside against contamination of grinding liquids, slurries, etc. in addition to facilitating handling of the wafer during backside processing. In an embodiment, an example adhesive tape may include but not limited to ultra-violet (UV)-cure type adhesive layer formed on a thermoplastic support tape. An UV-cure adhesive may include acrylate monomeric resin. The support tape may be made from a polymer such as polyolefin, polyvinyl or polyethylene. Known additional or alternative backgrind protection materials, UV/non-UV, may also be applied in practicing an embodiment of the present invention.

In an embodiment, after laminating the semiconductor wafer with an adhesive tape, the backside of the wafer may be ground or polished to a selected thickness, e.g., in a range of about 50 to 450 microns (block 406). Thereafter, in one variation, a dry or wet rough etching process may be performed on the backside of the wafer to impart a selected roughness thereto (block 408). In an embodiment, the roughness ($R_a$) value of the wafer backside after rough etch may typically be higher than the $R_a$ value before such an operation.

After rough etching to obtain a suitable texture, the semiconductor wafer containing the IC devices is prepared for subsequent process steps, commencing with the removal of the topside protection tape (block 410). In an embodiment where the adhesive tape laminating the wafer's topside is an UV-cure type, it may first be irradiated with UV light. When such an adhesive tape is exposed to UV light, chemicals of the adhesive material are cured and moisture is driven out of the adhesive tape, whereby the tackiness between the adhesive tape and the semiconductor wafer is reduced. Other de-tape processes may be applied where non-UV tape protection materials are used.

In accordance with the teachings of the present invention, following the removal of the topside protection material, the semiconductor wafer is subjected or exposed to a chemical solution cleaning process to remove contaminants from the semiconductor substrate's backside (block 412). In one example embodiment, such a chemical solution cleaning process may be applied immediately after removal of the topside protection material. Since the topside metal and passivation structures formed in the example semiconductor device 300 are exposed after the removal of the topside protection material, a carefully selected chemistry is required as part of the chemical solution cleaning process of the present invention so as not to damage the topside structures while being reactive enough to clean the backside surface sufficiently thoroughly. Furthermore, because various topside metallization schemes may be used for fabricating example semiconductor devices, the solution chemistry must also be calibrated accordingly. In one example implementation where the topside metal and passivation structure comprises a gold (Au) metal and polyimide passivation structure, an embodiment of the solution chemistry comprises a solution of a mixture having ammonium hydroxide ($NH_4OH$) and hydrogen peroxide ($H_2O_2$) in a ratio of one part of $NH_4OH$ to two parts of $H_2O_2$, and the mixture diluted in water ($H_2O$) in a ratio of one part of the mixture to about eight parts of water. One skilled in the art will recognize that variations of roughly similar ratios may be used in an implementation. Using this chemistry, a chemical solution cleaning process of the present invention may be applied to the semiconductor wafer(s) with the mixture maintained at a temperature range of about 40° C. to 60° C. for about 3-8 minutes in an apparatus including but not limited to a standard tank apparatus, spin apparatus, and the like.

In another embodiment where the topside metal and passivation structure comprises an aluminum (Al) metal and dielectric oxide passivation structure, the chemical solution cleaning process of the present invention comprises subjecting or exposing the semiconductor device/wafer to a mixture of $NH_4OH$ and $H_2O_2$ that is of lower concentration than the concentration of the mixture used for the Au/polyimide topside. In one example implementation, the $NH_4OH$ and $H_2O_2$ mixture is diluted in water in a ratio of one part of the mixture to about 50 parts of water, although variations of roughly similar ratios may be used. Further, the $NH_4OH$ and $H_2O_2$ mixture of lower concentration is applied to the semiconductor device having the Al/dielectric material topside at a lower temperature range than the temperature range used for the Au/polyimide topside, although a similar timing range may be applied. Accordingly, in an example process flow, the $NH_4OH/H_2O_2/H_2O$ solution of lower concentration is applied to the Al/dielectric material topside devices at a temperature range of about 20° C. to 40° C. for about 3-8 minutes in an apparatus including but not limited to a standard tank apparatus, spin apparatus, etc. Because Au is generally more stable than Al in a topside composition, $NH_4OH/H_2O_2$ mixtures of higher concentration may be applied at elevated temperatures to the wafers fabricated to have Au/polyimide based topside structures. It should therefore be appreciated that the ratios and/or concentrations of the chemical mixtures as well as temperature/timing ranges provided herein may be suitably modified within the scope of the present invention to design a specific chemistry depending upon the topside compositions. Favorable results have been obtained in wafer splits subjected to the inventive chemical solution processes of the present patent application wherein significant removal of residue/contaminants has been observed (e.g., visual inspection via scanning electron microscopy (SEM)) while the integrity of the device topside structure remained unharmed (e.g., as verified by both SEM and energy dispersive X-Ray spectrometry (EDS) analysis). In one particular implementation, the following chemistries have yielded positive results:

TABLE

| Process | Topside | Chemistry | Vol. Ratio | Temp. | Time | Defect Removal |
|---------|---------|-----------|------------|-------|------|----------------|
| A | Au + Polyimide | $NH_4OH/H_2O_2/H_2O$ | 1:2:8 | 50° C. | 5 min. | ~100% |
| B | Al + dielectric | $NH_4OH/H_2O_2/H_2O$ | 1:2:50 | 30° C. | 5 min. | ~100% |

Continuing to refer to FIG. 4, the example process 400 may follow applying a deionized (DI) water cleaning process (block 414) to the semiconductor device after the chemical cleaning process as set forth at block 412. In one example process flow, the DI water clean may be a 10-minute process performed as an overflow rinse at about 22° C. in a tank, which may be followed by a wafer drying process involving a vapor jet dryer (VJD) at 45° C. for about 20 minutes. Thereafter, a backside metallization (BSM) layer of suitable metal chemistry and thickness may be formed over the backside of the semiconductor substrate (block 416) as noted previously in reference to the example fabrication process set forth in FIG. 3. Appropriate downstream process steps may take place thereafter in accordance with a particular foundry's process/product flow.

Based on the foregoing, one skilled in the art will recognize that the present invention advantageously provides a chemical solution cleaning process that addresses the backside contamination issues while not harming the topside circuitry and structures of a variety of semiconductor devices that require backside thinning and metallization. As the inked wafer quantity (representing wafers with unacceptable contaminant defects) of a foundry can be reduced by a significant percentage, productivity of the foundry and the yield of a product line can also be substantially enhanced.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A method of fabricating a semiconductor device, the method comprising:
   forming topside circuitry for an integrated circuit (IC) on a topside of a semiconductor substrate of the semiconductor device, the topside circuitry having a topside metal structure and a topside passivation structure;
   applying a topside protection material to protect the topside circuitry;
   grinding a backside of the semiconductor substrate to a selected thickness;
   removing the topside protection material;
   after removal of the topside protection material, applying a chemical solution cleaning process to remove contaminants from the backside of the semiconductor substrate;
   applying a deionized (DI) water cleaning process to the semiconductor substrate after the chemical cleaning process; and
   forming a backside metallization (BSM) layer over the backside of the semiconductor substrate,
   wherein the topside metal structure comprises a gold (Au) metal structure and the topside passivation structure comprises a polyimide passivation structure, and further wherein the chemical solution cleaning process comprises exposing the semiconductor device to a solution of a mixture having ammonium hydroxide (NH4OH) and hydrogen peroxide (H2O2) in a ratio of one part of NH4OH to two parts of H2O2, and the mixture is diluted in water in a ratio of one part of the mixture to eight parts of water.

2. The method as recited in claim 1, further comprising performing an etching process to impart a selected roughness to the backside of the semiconductor substrate before removing the topside protection material.

3. The method as recited in claim 1, wherein the IC comprises a power MOSFET circuit, and further wherein the semiconductor substrate is ground to a thickness of 35 to 400 microns (μm).

4. The method as recited in claim 1, wherein the diluted mixture is maintained at a temperature range of 40° C. to 60° C. for 3 to 8 minutes.

5. The method as recited in claim 1, wherein the BSM layer comprises a metal composition selected from the group consisting of: titanium (Ti), titanium-nickel-silver (Ti—Ni—Ag), nickel-vanadium (Ni—V), nickel-vanadium-silver (Ni—V—Ag), nickel-vanadium-gold (Ni—V—Au), titanium-platinum-gold (Ti—Pt—Au), gold-titanium-nickel-vanadium-silver (Au—Ti—Ni—V—Ag), and chromium-nickel-vanadium-silver (Cr—Ni—V—Ag).

6. A method of fabricating a semiconductor device, the method comprising:
   forming topside circuitry for an integrated circuit (IC) on a topside of a semiconductor substrate of the semiconductor device, the topside circuitry having a topside metal structure and a topside passivation structure;
   applying a topside protection material to protect the topside circuitry;
   grinding a backside of the semiconductor substrate to a selected thickness;
   removing the topside protection material;
   after removal of the topside protection material, applying a chemical solution cleaning process to remove contaminants from the backside of the semiconductor substrate;
   applying a deionized (DI) water cleaning process to the semiconductor substrate after the chemical cleaning process; and
   forming a backside metallization (BSM) layer over the backside of the semiconductor substrate,
   wherein the topside metal structure comprises an aluminum (Al) metal structure and a topside passivation structure comprises a dielectric oxide passivation structure, and further wherein the chemical solution cleaning process comprises exposing the semiconductor device to a solution of a mixture having ammonium hydroxide ($NH_4OH$) and hydrogen peroxide ($H_2O_2$) in a ratio of one part of $NH_4OH$ to two parts of $H_2O_2$, and the mixture is diluted in water in a ratio of one part of the mixture to 50 parts of water.

7. The method as recited in claim 6, wherein the diluted mixture is maintained at a temperature range of 20° C. to 40° C. for 3 to 8 minutes.

8. The method as recited in claim 6, further comprising performing an etching process to impart a selected roughness to the backside of the semiconductor substrate before removing the topside protection material.

9. The method as recited in claim 6, wherein the IC comprises a power MOSFET circuit, and further wherein the semiconductor substrate is ground to a thickness of 35 to 400 microns (μm).

10. The method as recited in claim 6, wherein the BSM layer comprises a metal composition selected from the group consisting of: titanium (Ti), titanium-nickel-silver (Ti—Ni—Ag), nickel-vanadium (Ni—V), nickel-vanadium-silver (Ni—V—Ag), nickel-vanadium-gold (Ni—V—Au), titanium-platinum-gold (Ti—Pt—Au), gold-titanium-nickel-vanadium-silver (Au—Ti—Ni—V—Ag), and chromium-nickel-vanadium-silver (Cr—Ni—V—Ag).

11. A method of fabricating a semiconductor device, the method comprising:
   forming topside circuitry for an integrated circuit (IC) on a topside of a semiconductor substrate of the semiconductor device, the topside circuitry having a topside metal structure and a topside passivation structure;
   forming a backside source contact layer connected to a FET source on the topside;
   applying a topside protection material to protect the topside circuitry;

grinding a backside of the semiconductor substrate to a selected thickness;

removing the topside protection material;

after removal of the topside protection material, applying a chemical solution cleaning process to remove contaminants from the backside of the semiconductor substrate;

roughening the backside of the semiconductor substrate; and forming a backside metallization (BSM) layer over the roughened backside, the BSM layer providing a conductive contact to the source.

12. The method as recited in claim 11, wherein the roughening includes a wet rough etching process.

13. The method as recited in claim 11, wherein the roughening includes a dry rough etching process.

14. The method as recited in claim 11, wherein the IC comprises a power MOSFET circuit, and further wherein the semiconductor substrate is ground to a thickness of 35 to 400 microns (μm).

15. The method as recited in claim 11, wherein the topside metal structure comprises a gold (Au) metal structure and the topside passivation structure comprises a polyimide passivation structure, and further wherein the chemical solution cleaning process comprises exposing the semiconductor device to a solution of a mixture having ammonium hydroxide (NH4OH) and hydrogen peroxide (H2O2) in a ratio of one part of NH4OH to two parts of H2O2, and the mixture diluted in water in a ratio of one part of the mixture to eight parts of water.

16. The method as recited in claim 15, wherein the diluted mixture is maintained at a temperature range of 40° C. to 60° C. for 3 to 8 minutes.

17. The method as recited in claim 11, wherein the topside metal structure comprises an aluminum (Al) metal structure and a topside passivation structure comprises a dielectric oxide passivation structure, and further wherein the chemical solution cleaning process comprises exposing the semiconductor device to a solution of a mixture having ammonium hydroxide ($NH_4OH$) and hydrogen peroxide ($H_2O_2$) in a ratio of one part of $NH_4OH$ to two parts of $H_2O_2$, and the mixture diluted in water in a ratio of one part of the mixture to 50 parts of water.

18. The method as recited in claim 17, wherein the diluted mixture is maintained at a temperature range of 20° C. to 40° C. for 3 to 8 minutes.

19. The method as recited in claim 11, wherein the BSM layer comprises a metal composition selected from the group consisting of: titanium (Ti), titanium-nickel-silver (Ti—Ni—Ag), nickel-vanadium (Ni—V), nickel-vanadium-silver (Ni—V—Ag), nickel-vanadium-gold (Ni—V—Au), titanium-platinum-gold (Ti—Pt—Au), gold-titanium-nickel-vanadium-silver (Au—Ti—Ni—V—Ag), and chromium-nickel-vanadium-silver (Cr—Ni—V—Ag).

\* \* \* \* \*